United States Patent
Kim et al.

(10) Patent No.: US 6,451,684 B1
(45) Date of Patent: Sep. 17, 2002

(54) SEMICONDUCTOR DEVICE HAVING A CONDUCTIVE LAYER SIDE SURFACE SLOPE WHICH IS AT LEAST 90° AND METHOD FOR MANUFACTURING THE SAME

(75) Inventors: Myeong-cheol Kim, Suwon (KR); Hee-sung Yang, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/656,889

(22) Filed: Sep. 7, 2000

Related U.S. Application Data

(62) Division of application No. 09/359,054, filed on Jul. 21, 1999.

(30) Foreign Application Priority Data

Jul. 21, 1998 (KR) .............................. 98-29289

(51) Int. Cl.⁷ .......................................... H01L 21/4763
(52) U.S. Cl. .................. 438/622; 438/623; 438/624; 438/645; 438/646
(58) Field of Search ................ 438/548, 599, 438/622, 623, 624, 645, 646, 697

(56) References Cited

U.S. PATENT DOCUMENTS 5,840,619 A  * 11/1998 Hayashide .................. 428/598
6,211,051 B1 *  4/2001 Jurgensen ................... 438/597

* cited by examiner

Primary Examiner—David Nelms
Assistant Examiner—Reneé R. Berry
(74) Attorney, Agent, or Firm—Marger Johnson & McCollom, P.C.

(57) ABSTRACT

A semiconductor device having a conductive layer side surface slope of at least 90° and a method for making the same is provided. An interlayer dielectric film and a conductive layer are formed on a semiconductor substrate. The interlayer dielectric film has a side surface slope defining a hole of less than 90°. A conductive layer having a side surface slope of at least 90° is formed in the hole defined by the interlayer dielectric film. The semiconductor device is manufactured by coating a preliminary film on a semiconductor substrate. Patterning the preliminary film forms a preliminary film pattern having a side surface slope of 90°. The interlayer dielectric film is formed on the semiconductor substrate and the preliminary film pattern. Removing some of the interlayer dielectric film exposes an upper surface of the preliminary film pattern. Removing the preliminary film pattern forms an interlayer dielectric film pattern having a side surface slope of no more than 90° and defining a hole. Forming a conductive material in the hole forms a conductive layer having a side surface slope of at least 90°.

12 Claims, 6 Drawing Sheets

SEMICONDUCTOR DEVICE HAVING A CONDUCTIVE LAYER SIDE SURFACE SLOPE WHICH IS AT LEAST 90° AND METHOD FOR MANUFACTURING THE SAME

This application is a divisional, of prior application Ser. No. 09/359,054, filed Jul. 21, 1999.

BACKGROUND OF THE INVENTION

1. Field of the Invention

The present invention relates to a semiconductor device and, more particularly, to a semiconductor device having a conductive layer having a side surface slope of at least 90° and a method for manufacturing the same.

2. Description of the Related Art

Conventionally, the side surface slope of an insulating film pattern having a hole for forming a conductive layer using a dry etching method is greater than 90°. When a Damascene conductive layer is formed by performing a Damascene process using the insulating film pattern as a mask, the side surface slope of the formed Damascene conductive layer is smaller than 90°. When another adjacent conductive layer is formed in a subsequent process, a misalignment margin between two adjacent conductive layers is reduced. Thus, a short might be generated between the adjacent two conductive layers. Though the etching process is performed to insure a 90° side surface slope of the insulating film pattern, the side surface slope of the insulating film pattern often is greater than 90° after cleaning.

FIGS. 1A through 1E are sectional views of a conventional method for manufacturing a semiconductor device having the Damascene conductive layer. First, as shown in FIG. 1A, a first insulating film 110 is formed on a semiconductor substrate 100. Thereafter, a plug 120 is formed of a conductive material, such as polysilicon, between portions of the first insulating film 110. A second insulating film 130 is formed on the first insulating film 110 and the plug 120. As shown in FIG. 1B, a photoresist pattern 140 is formed on a second insulating film 130 by exposing and developing the second insulating film using conventional lithography. A second insulating film pattern 130 is formed by etching the second insulating film 130 using the photoresist pattern 140 as a mask thereby exposing the plug 120 (FIG. 1C). Cleaning is then performed using a radio frequency (RF) etching method after removing the photoresist pattern 140. In general, the second insulating film pattern 130' is formed by using a dry etching process. The side surface slope α of the second insulating film pattern 130' formed is greater than 90°.

With reference to FIG. 1D, a conductive material 150 such as polysilicon or metal is deposited between portions of the second insulating film pattern 130'. As shown in FIG. 1E, flattening the conductive layer 150 using a chemical mechanical polishing (CMP) method completes a Damascene conductive layer 150'. In the CMP method, the upper surface of the second insulating film pattern 130' is used as an end point. The completed conductive layer 150' has a structure in which a side surface slope is less than 90°. Thus, the misalignment margin is reduced in a subsequent contact forming process increasing the risk of developing shorts between adjacent conductive layers. Accordingly, a need remains for a semiconductor device and a method for manufacturing the same in which the side surface slope of a conductive layer is at least 90° to thereby increase the misalignment margin.

SUMMARY OF THE INVENTION

It is an object of the present invention to overcome the problems associated with prior art semiconductor memory devices and methods for making the same.

It is another object of the present invention to provide a semiconductor device having a conductive layer that prevents the generation of a short between adjacent conductive layers.

It is yet another object of the present invention to provide a method for manufacturing a semiconductor device having a conductive layer that prevents the generation of shorts between adjacent conductive layer.

Accordingly, a semiconductor device is provided. The semiconductor device having a conductive layer according to the present invention comprises an interlayer dielectric film and a conductive layer on a semiconductor substrate. The interlayer dielectric film defines a hole and has a side surface slope of no more than 90°. The conductive layer formed in the hole defined by the interlayer dielectric film has a side surface slope of at least 90°.

The interlayer dielectric film pattern is preferably formed of a silicate on glass, a flowable oxide, an undoped silicate glass, a plasma enhanced-tetra ethyl ortho silicate, boron phosphorus silicate glass, or a high density plasma oxide. The conductive layer is preferably formed of doped polysilicon, W, WSi, Cu, Ti, TiN, Al, Pt, Ir, or Ru.

A method for manufacturing the above-described semiconductor memory device is also provided. A preliminary film is deposited on a semiconductor substrate. A preliminary film pattern the side surface slope of which is at least 90° is formed by patterning the preliminary film. An interlayer dielectric film is formed on the semiconductor substrate and the preliminary film pattern. The upper surface of the preliminary film pattern is exposed by removing some of the interlayer dielectric film. An interlayer dielectric pattern defining a hole and having a side surface slope of no more than 90° is formed by removing the preliminary film pattern. A conductive layer the side surface slope is at least 90° is formed by forming a conductive material in the hole.

The preliminary film is preferably formed using nitride silicon or polysilicon. The interlayer dielectric film is preferably formed using a flowable insulating material such as silicate on glass or flowable oxide.

Forming the interlayer dielectric film includes forming an unflowable insulating film. The method further includes forming a flowable insulating film on the interlayer dielectric film after forming the interlayer dielectric film and flattening the flowable insulating film. Removing some of the interlayer dielectric film and flowable insulating film exposes an upper surface of the preliminary film pattern.

The semiconductor device of the present invention prevents the generation of a short between a conductive layer formed in the hole and an adjacent conductive layer by increasing a misalignment margin during a subsequent process for forming the contact hole. In particular, when the conductive layer is used as a storage node of a capacitor, the coverage of a dielectric film is improved in a subsequent processing of forming a dielectric film by the CVD method.

BRIEF DESCRIPTION OF THE DRAWINGS

The foregoing objects, features, and advantages of the present invention will become more readily apparent from the detailed description of a preferred embodiment that proceeds with reference to the following drawings.

DESCRIPTION OF THE PREFERRED EMBODIMENTS

Figure 1A:
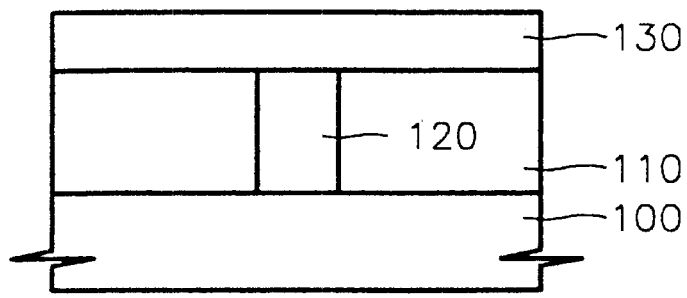
FIGS. 1A through 1E are sectional views of a method for manufacturing a conventional semiconductor device including a conductive layer, the conductive layer having a side surface slope that is less than 90°.
Figure 1B:
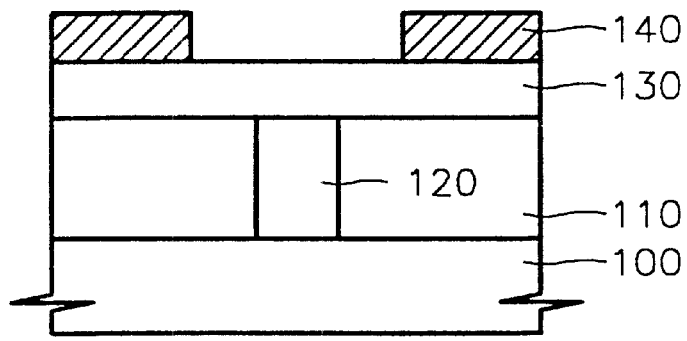
Figure 1C:
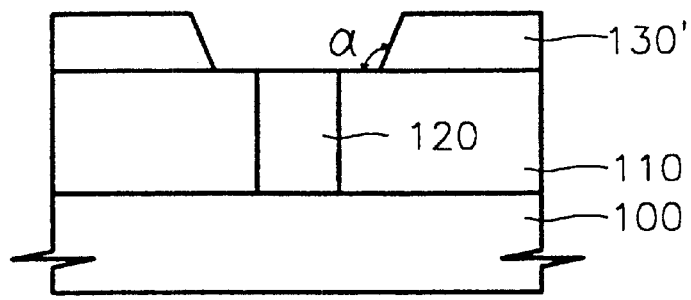
Figure 1D:
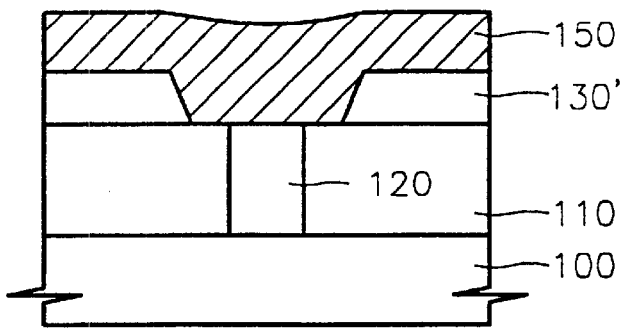
Figure 1E:
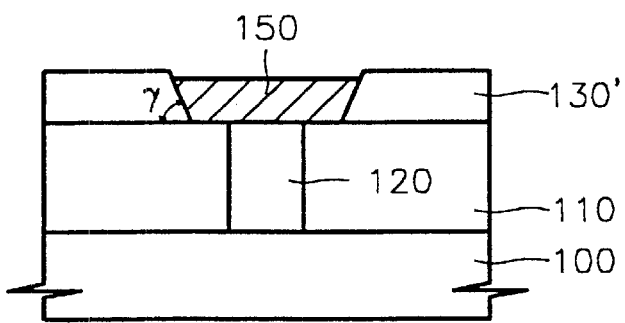

The drawings are exaggerated to facilitate understanding. For example, the degree by which the side surface of a pattern tilts is actually difficult to see with the naked eye. However, in the drawings, the tilt is exaggerated to facilitate understanding. Also, when a film is referred as being formed on another film or a substrate, it might be formed directly on the other film or the substrate or an interlayer may be formed therebetween. In the drawings, the same reference numerals denote the same members.

Figure 2:
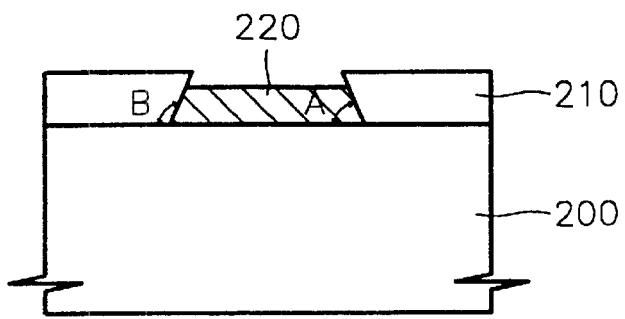
FIG. 2 is a sectional view of a semiconductor device according to the present invention, the semiconductor device including a conductive layer having a side surface slope that is at least 90°.

FIG. 2 is a sectional view of a semiconductor device according to the present invention. The semiconductor device has a conductive layer with at least a 90° side surface slope. Referring to FIG. 2, in the semiconductor device according to the present invention, an interlayer dielectric film pattern 210 and a conductive layer 220 are formed on a semiconductor substrate 200. A plug, (not shown) formed of a conductive material such as polysilicon, can be further formed between the semiconductor substrate 200 and the conductive layer 220.

The side surface slope A of the interlayer dielectric film pattern 210 is less than 90°. The interlayer dielectric film pattern 210 is formed of an easily flowing material such as a silicate on glass (SOG) or a flowable oxide (FOX). Alternatively, the interlayer dielectric film 210 is formed a material which does not easily flow such as an undoped silicate glass (USG), a plasma enhanced tetra ethyl ortho silicate PE-TEOS), a boron phosphorus silicate glass (BPSG), or a high density plasma (HDP). The conductive layer pattern 220, formed between portions of the interlayer dielectric film pattern 210, has a side surface slope B of at least 90°. The conductive layer pattern 220 is formed of a doped polysilicon, e.g., W, WSi, Cu, Ti, TiN, Al, Pt, Ir, or Ru.

When the conductive layer 220 is used as the bit line for a DRAM, the misalignment margin of the conductive layer 220 increases in a subsequent contact hole forming process. Accordingly, the probability of a short occurring between the conductive layer and a storage electrode filling the contact hole decreases. When the conductive layer 220 is used as the storage node of a capacitor, the conductive layer is formed of a metal such as Pt. In this case, since the storage node has a positive side wall slope of at least 90°, step coverage of a dielectric film such as a barium strontium titanate (BST) film formed by the CVD method, is improved.

Figure 3A:
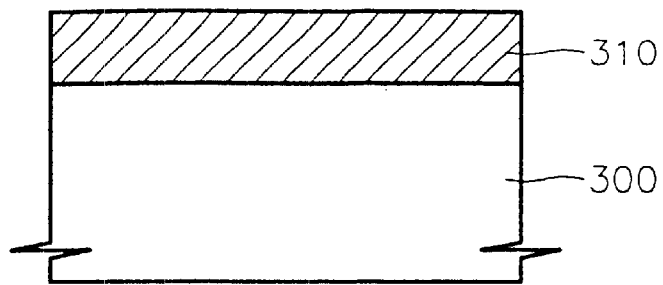
FIGS. 3A through 3H are sectional views of a first embodiment method for manufacturing semiconductor device according to the present invention, the semiconductor device including a conductive layer having a side surface slope that is at least 90°.

The method for manufacturing the semiconductor device having the above-described conductive layer is described with reference to the attached drawings. FIGS. 3A through 3H are sectional views of a first embodiment method for manufacturing the semiconductor device according to the present invention, the semiconductor device including a conductive layer having a 90° the side surface slope. Referring to FIG. 3A, a preliminary film 310 is deposited on a semiconductor substrate 300. A nitride silicon film or a polysilicon film can be used as the preliminary film 310 according to a material forming the plug. When the plug (not shown) is formed on the semiconductor substrate 300 and the conductive layer contacts the plug, the preliminary film 310 is made of polysilicon where the plug is a metal such as W. The preliminary film 310 is made of nitride silicon where the plug is made of polysilicon.

Figure 3B:
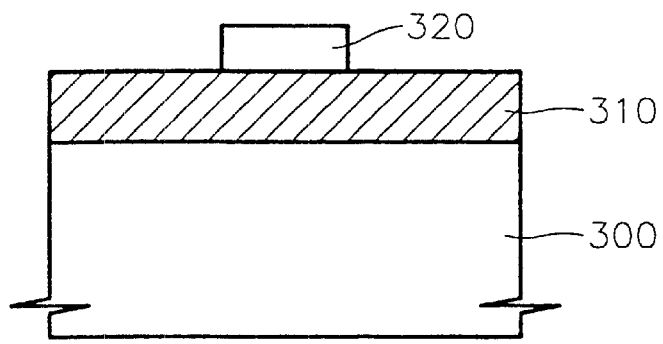
Figure 3C:
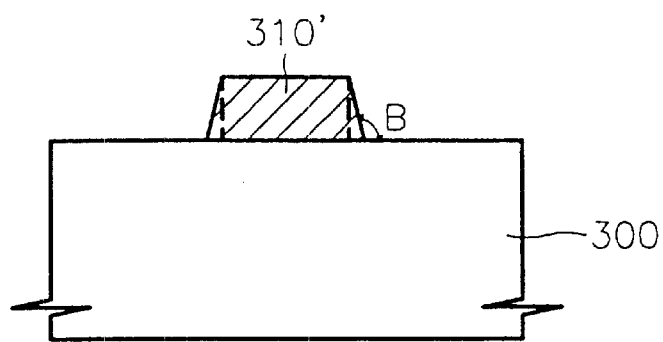

As shown in FIG. 3B, a photoresist pattern 320 is formed on the preliminary film 310. The photoresist pattern 320 is formed by coating a photoresist film on the preliminary film 310 and then exposing and developing the photoresist film using conventional lithography methods. The photoresist pattern 320 is removed after dry etching the preliminary film 310 using the photoresist pattern 320 as an etching mask (FIG. 3C). The side surface slope B of a preliminary film pattern 310' formed by completing the etching processes is theoretically 90° as shown in FIG. 3C. Etching must be performed on the portion of the film 310 marked with a dotted line in the drawing. However, the side surface slope is actually greater than 90°. After removing the photoresist pattern 320, the device is cleaned using the RF etching method.

Figure 3D:
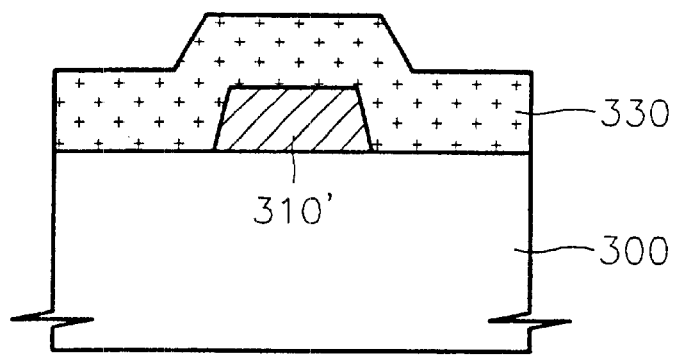
Figure 3E:
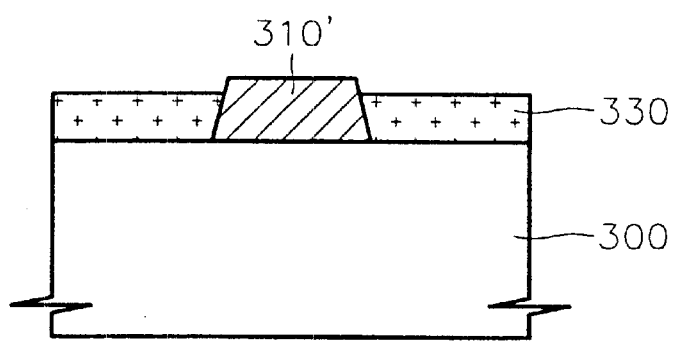
Figure 3F:
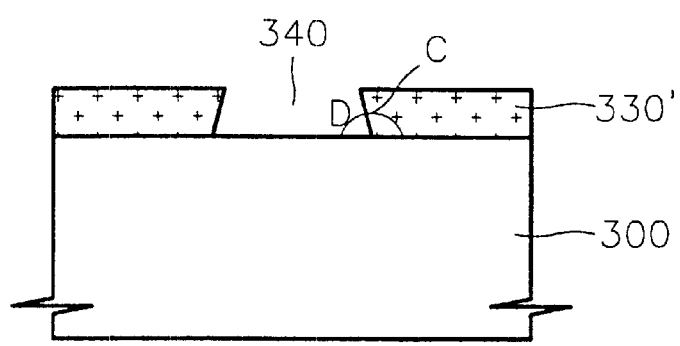

As shown in FIG. 3D, an interlayer dielectric film 330 is coated on the exposed part of the semiconductor substrate 300 and the preliminary film pattern 310', The interlayer dielectric film 330 is formed of an easily flowing material such as SOG or FOX. Referring to FIG. 3E, the interlayer dielectric film 330 is etched back so that the preliminary film pattern 310' is exposed. Since the SOG or the FOX material that forms the interlayer dielectric film 330 is an easily flowing material, the degree of flatness is not remarkably reduced even though the etch back process is performed without performing an additional flattening process. However, a flattening process using the CMP method can be performed if desired. The preliminary film pattern 310' is removed as shown in FIG. 3F. The side surface slope D of the interlayer dielectric film pattern 330' is less than 90°. Therefore, the interlayer dielectric film pattern 330' defines a hole 340 in which an external angle C formed by the horizontal surface of the semiconductor substrate 300 and the side wall of the hole is at least 90°. When the preliminary film pattern 310' is a nitride silicon film pattern, it is removed by a wet etching method using phosphoric acid. When the preliminary film pattern 310' is a polysilicon film pattern, it is removed using a dry etching method.

Figure 3G:
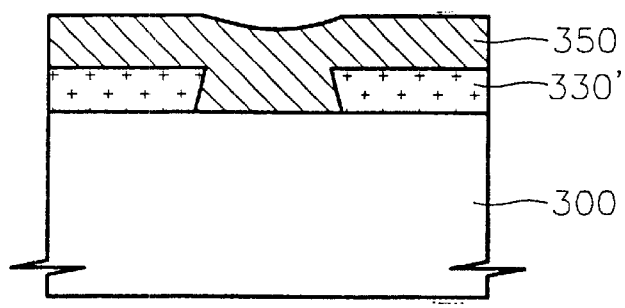
Figure 3H:
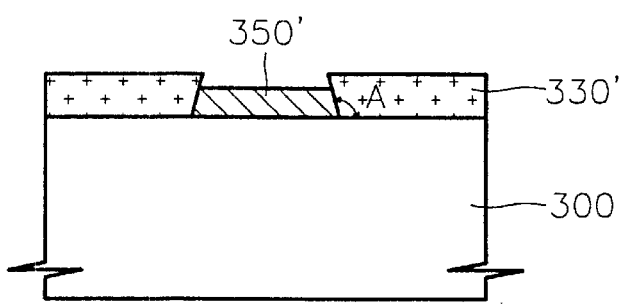

As shown in FIG. 3G, a conductive film 350, having a predetermined thickness such as a metal film or a polysilicon film, is deposited on the interlayer dielectric film 330. The conductive film 350 is then flattened using the upper surface of the interlayer dielectric film pattern 330' as an end point (FIG. 3H). As a result, the conductive layer 350' has a side surface slope A of at least 90°.

FIGS. 4A through 4D are sectional views of a second embodiment method for manufacturing the semiconductor device according to the present invention, the semiconductor memory device including a conductive layer having a side slope of at least 90°. In the second embodiment of the present invention, the interlayer dielectric film 330 is formed of a material that does not easily flow, for example, USG, PE-TEOS, BPSG, or HDP oxide. After performing the process steps shown in FIGS. 3A through 3D, the steps described in FIGS. 4A through 4D are performed.

Figure 4A:
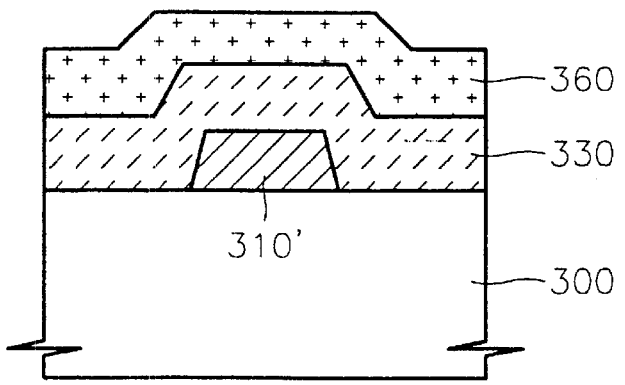
FIGS. 4A through 4D are sectional views of a second embodiment method for manufacturing a semiconductor device according to the present information, the semiconductor device including a conductive layer having a side surface slope that is at least 90°.

Referring to FIG. 4A, an interlayer dielectric film 330 is deposited on the semiconductor substrate 300 and the preliminary film pattern 310' using a material that does not easily flow. Thereafter, an insulating film 360, made of a material that easily flows such as SOG or FOX, is formed on the interlayer dielectric film 330.

Figure 4B:
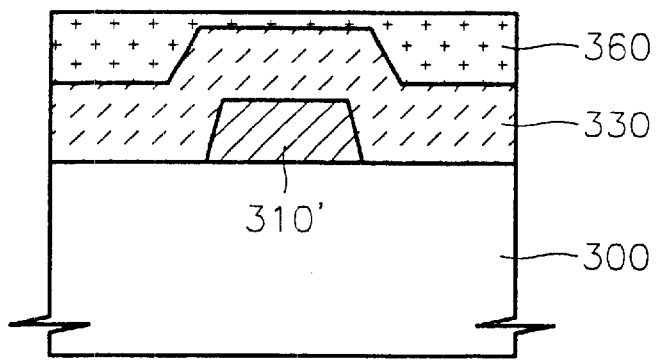

The flowable insulating film 360 is flattened using the CMP method (FIG. 4B).

Figure 4C:
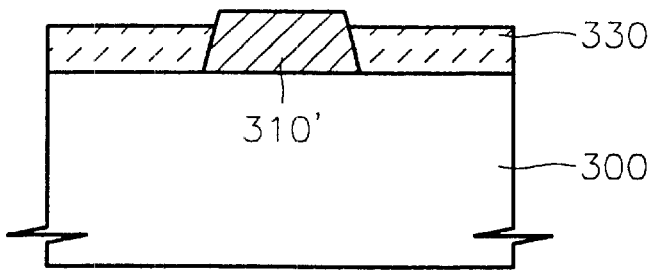

As shown in FIG. 4C, the flowable insulating film 360 and the interlayer dielectric film 330 are flattened by the etch back method or the CMP method using the upper surface of the preliminary film pattern 310' as an end point. At this time, the etch back or CMP method is performed under the condition that selective index between the flowable insulating film 360 and the interlayer dielectric film 330 is 1:1.

Figure 4D:
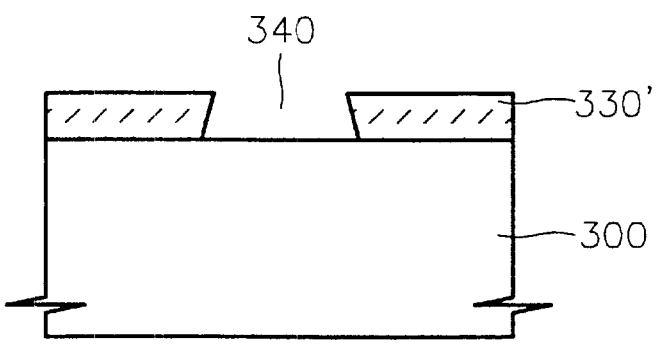

As shown in FIG. 4D, the hole 340 and the interlayer dielectric film pattern 330' are formed by removing the preliminary film pattern 310', The preliminary film pattern 310' is removed by wet etching using phosphoric acid where the preliminary film pattern 310' is a nitride silicon film pattern and by dry etching where the preliminary film pattern 310' is a polysilicon film pattern. Subsequent processes proceed are as described in the first embodiment explained with reference to FIGS. 3G and 3H.

The present invention will be described in more detail with reference to the following experiment. The experiment, however, should not be read as limiting the scope of the present invention.

EXPERIMENT

In a DRAM, the reduction (in nm) of the misalignment margin of a bit line pattern was measured according to the relationship between the thickness D (in angstroms Å) and the side surface slope γ (in degrees °). The results are shown in Table 1.

TABLE 1

| γ | D = 1000 Å | D = 1500 Å | D = 2500 Å |
|---|---|---|---|
| 90 | 0 | 0 | 0 |
| 88 | 3.5 | 5.2 | 8.7 |
| 86 | 7.0 | 10.5 | 17.5 |

As shown in TABLE 1, for a general bit line the thickness D equal to 1,000 Å and a side surface slope γ of 88°, the misalignment margin is reduced by 3.5 nm—relatively large amount—with a large misalignment margin, the probability of a short developing between metal wirings become large. Therefore, in order to reduce the probability of shorts between metal wiring, it is preferable to form a conductive film having a side surface slope γ of at least 90°.

What is claimed is:

1. A method for manufacturing a semiconductor device, comprising:
   depositing a preliminary film on a semiconductor substrate;
   patterning the preliminary film using a photoresist pattern, the patterned preliminary film having a side surface slope greater than 90°;
   forming an interlayer dielectric film on the semiconductor substrate and the patterned preliminary film pattern;
   removing a portion of the interlayer dielectric film thereby exposing the patterned preliminary film;
   forming an interlayer dielectric film pattern by removing the patterned preliminary film, the interlayer dielectric film pattern defining a hole and having a side surface slope of less than 90°; and
   forming a conductive layer in the hole, the conductive layer having a side surface slope greater than 90°.

2. The method of claim 1 wherein depositing a preliminary film includes depositing a preliminary film made of nitride silicon or polysilicon.

3. The method of claim 2 wherein forming an interlayer dielectric film pattern includes removing the patterned preliminary film by a wet etching method when the preliminary is formed of nitride silicon and by a dry etching method when the patterned preliminary film is formed of polysilicon.

4. The method of claim 1 wherein forming an interlayer dielectric film includes forming an interlayer dielectric film using a flowable insulating material.

5. The method of claim 4 wherein forming an interlayer dielectric film using a flowable insulating material includes using silicate on glass or flowable oxide.

6. The method of claim 1 wherein removing a portion of the interlayer dielectric film includes using an etch back or a chemical mechanical polishing (CMP) method.

7. The method of claim 1 wherein forming the interlayer dielectric film,
   forming an interlayer dielectric film pattern, and forming a conductive layer are replaced with:
      forming an interlayer dielectric film of an unflowable material;
      forming an insulating film of a flowable material;
      flattening the insulating film;
      removing portions of the interlayer dielectric film and the insulating film after flattening the insulating film; and
      forming an interlayer dielectric film pattern by removing the patterned preliminary film, the interlayer dielectric film pattern defining a hole and having a side surface slope of less than 90°.

8. The method of claim 7 wherein forming an interlayer dielectric film of unflowable material includes forming an interlayer dielectric film of undoped silicate glass, plasma enhanced-tetra ethyl ortho silicate, boron phosphorus silicate glass, or a high density plasma oxide.

9. The method of claim 7 wherein forming an insulating film includes forming an insulating film of silicate on glass or flowable oxide.

10. The method of claim 7 wherein removing portions of the interlayer dielectric film and the insulating film includes using etch back or CMP method.

11. The method of claim 10 wherein removing portions of the interlayer dielectric film and the insulating film using an etch back or CMP method includes performing the etch back or CMP method where a selective index between the interlayer dielectric film and the insulating film is 1:1.

12. The method of claim 1, wherein the conductive layer is formed of doped polysilicon, W, Wsi, Cu, Ti, TiN, Al, Pt, Ir or Ru.

* * * * *